(12) United States Patent
Wei et al.

(10) Patent No.: US 11,450,690 B2
(45) Date of Patent: Sep. 20, 2022

(54) DISPLAY MODULE AND DISPLAY DEVICE

(71) Applicant: Huawei Technologies Co., Ltd., Shenzhen (CN)

(72) Inventors: Shanshan Wei, Shanghai (CN); Yanfeng Liang, Shanghai (CN); Yuanjian Liu, Shanghai (CN); Jianhui Li, Dongguan (CN); Haohui Long, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/419,118

(22) PCT Filed: Dec. 29, 2018

(86) PCT No.: PCT/CN2018/125804
§ 371 (c)(1),
(2) Date: Jun. 28, 2021

(87) PCT Pub. No.: WO2020/133490
PCT Pub. Date: Jul. 2, 2020

(65) Prior Publication Data
US 2022/0020779 A1  Jan. 20, 2022

(51) Int. Cl.
*H01L 27/12* (2006.01)
*G02F 1/1345* (2006.01)
*G06F 3/041* (2006.01)
*G02F 1/1333* (2006.01)
*H01L 27/32* (2006.01)
*H01L 51/52* (2006.01)

(52) U.S. Cl.
CPC ...... *H01L 27/1218* (2013.01); *G02F 1/13452* (2013.01); *G06F 3/0412* (2013.01); *H01L 27/124* (2013.01); *H01L 27/3276* (2013.01); *H01L 51/5253* (2013.01); *G02F 1/13338* (2013.01); *G02F 2201/50* (2013.01); *H01L 27/323* (2013.01)

(58) Field of Classification Search
CPC ............... H01L 27/1218; H01L 27/124; H01L 27/3276; H01L 51/5253; H01L 27/323; G02F 1/13452; G02F 1/13338; G02F 2201/50; G06F 3/0412
USPC .......................................... 349/12, 149–152
See application file for complete search history.

(56) References Cited

U.S. PATENT DOCUMENTS 9,832,868 B1    11/2017  Wright et al.
2008/0239192 A1 10/2008  Oohira
2016/0041421 A1  2/2016  Morioka et al.
(Continued)

FOREIGN PATENT DOCUMENTS

CN    105870159 A    8/2016
CN    107561806 A    1/2018
(Continued)

*Primary Examiner* — Charles S Chang
(74) *Attorney, Agent, or Firm* — Conley Rose, P.C.

(57) ABSTRACT

A display includes at least an array substrate, and the array substrate has a drive circuit layer. At least one first notch is provided on an outer edge of a lead-out side of the array substrate, and a first conductor is disposed in each first notch. A first end of the first conductor is in contact with a lead end of the drive circuit layer, and a second end of the first conductor extends along the first notch to a back side of the array substrate.

20 Claims, 4 Drawing Sheets

(56) References Cited

U.S. PATENT DOCUMENTS

| 2018/0188579 | A1 | 7/2018 | Jeong et al. | |
| 2020/0043948 | A1* | 2/2020 | Liu | G02F 1/1345 |
| 2020/0081568 | A1* | 3/2020 | Xu | G06F 3/0443 |

FOREIGN PATENT DOCUMENTS

| CN | 107765919 A | 3/2018 |
| CN | 108550584 A | 9/2018 |
| CN | 108957880 A | 12/2018 |
| CN | 109003998 A | 12/2018 |
| JP | 2007171363 A | 7/2007 |
| JP | 2009199107 A | 9/2009 |
| JP | 2018067507 A | 4/2018 |

* cited by examiner

DISPLAY MODULE AND DISPLAY DEVICE

CROSS-REFERENCE TO RELATED APPLICATIONS

This is a U.S. National Stage of International Patent Application No. PCT/CN2018/125804 filed on Dec. 29, 2018, which is hereby incorporated by reference in its entirety.

TECHNICAL FIELD

This application relates to the display field, and in particular, to a display module and a display device that can implement a narrow bezel.

BACKGROUND

With the development of science and technologies, manufacturing technologies and processes of displays are continuously improved. A relatively common liquid crystal display (Liquid Crystal Display, LCD for short) occupies an important position in the display field with advantages of good image display quality, low energy consumption, and environmental protection, and an organic light emitting diode (Organic Light Emitting, OLED for short) display that emerges with the development of technologies is also widely used in display technologies.

Currently, both an LCD display and an OLED display include a display panel. The display panel includes an array substrate. A thin film transistor (Thin Film Transistor, TFT for short) and a drive circuit are disposed on the array substrate. The drive circuit on the array substrate is electrically connected to a flexible printed circuit (Flexible Printed Circuit, FPC for short) by using a flexible printed circuits board on glass (Flexible printed circuits board On Glass, FOG for short). The FPC is bound to a display chip or a display and touch integrated chip. In other words, a chip on film (Chip on film, COF for short) is electrically connected, and is then connected to a mainboard by using a boarder to boarder (Boarder to boarder, BTB for short) connector to implement display and touch drive.

However, because the drive circuit on the array substrate needs to be connected to the FPC by using the FOG, the COF needs to be designed on one side of the display panel to output the drive circuit on the array substrate to the mainboard. As a result, a non-display area at an edge of the display panel is finally increased, and a relatively large black bezel of the display is caused. Therefore, a narrow bezel requirement of the display cannot be met.

SUMMARY

This application provides a display module and a display device, to implement a narrow bezel of a display, thereby resolving a problem that an existing display cannot meet a narrow bezel requirement because a COF needs to be designed on one side of a display panel of the display.

This application provides a display module, including at least an array substrate, where the array substrate has a drive circuit layer, where at least one first notch is provided on an outer edge of a lead-out side of the array substrate, a first conductor is disposed in each first notch, a first end of the first conductor is in contact with a lead end of the drive circuit layer, a second end of the first conductor extends along the first notch to a back side of the array substrate, and the second end of the first conductor is used to electrically connect to a main control board disposed on the back side of the array substrate.

According to the display module provided in this application, at least one first notch is provided on an outer edge of a lead-out side of the array substrate, and a first conductor is disposed in each first notch. A first end of the first conductor is in contact with a lead end of the drive circuit layer, and a second end of the first conductor extends along the first notch to a back side of the array substrate. In this way, a main control board is electrically connected to a drive circuit by using the first conductor extending to the back side of the array substrate. The first conductor is located in the first notch provided on the edge of the array substrate. Therefore, a problem of additionally forming a bezel on an edge of the display panel is totally avoided. Compared with the related art, a bezel formed during FOG connection is avoided, so that a total width of a black bezel in the display is reduced, a narrow bezel of the display is implemented, and a screen-to-body ratio of the display is increased. In addition, when the first conductor is used to connect the drive circuit to the main control board, quantities of used FPCs and glass substrates are reduced, and a process of connecting an FPC and a glass substrate in an FOG connection process is avoided. In addition, in this application, because an outer edge of the lead-out side of the array substrate is provided with a notch, compared with a full through hole, a risk of screen cracking in a dropping process is greatly reduced, and anti-drop reliability is higher. Therefore, the display module provided in this embodiment implements the narrow bezel of the display, reduces the risk of screen cracking in the dropping process, reduces the quantities of used FPCs and glass substrates, and resolves the problem that an existing display cannot meet a narrow bezel requirement because a COF needs to be designed on one side of a display panel of the display.

In a possible implementation of the first aspect, the method further includes: an opposite substrate opposite to the array substrate, where a touch circuit is disposed on the opposite substrate; and at least one second notch is provided on an outer edge that is on the opposite substrate and that corresponds to the lead-out side of the array substrate, a second conductor is disposed in each second notch, a first end of the second conductor is in contact with a lead end of the touch circuit, and a second end of the second conductor extends along the second notch to the array substrate and is electrically connected to the first end of the first conductor, so that the touch circuit is electrically connected to the main control board by using the first conductor and the second conductor.

By providing the second notch on the outer edge of the opposite substrate, both ends of the second conductor extend along the second notch to one side on which the touch circuit is disposed on the opposite substrate and one side on which the opposite substrate faces the array substrate, so that the touch circuit is finally connected to the main control board by using the second conductor and the first conductor. In other words, the touch circuit on the opposite substrate is connected to the back side of the array substrate, and forming a new bezel on the outer edge of the opposite substrate is avoided.

In a possible implementation of the first aspect, inner walls of the first notch and the second notch are non-closed arcuate walls.

In a possible implementation of the first aspect, the first notch and the second notch are semi-circular holes penetrating through front and rear surfaces of the array substrate.

In a possible implementation of the first aspect, the first notch and the second notch are semi-conical holes whose opening gradually decreases from top to bottom.

In a possible implementation of the first aspect, the first conductor and the second conductor are conductive materials filled in the first notch and the second notch, or the first conductor and the second conductor are conductive wires.

In a possible implementation of the first aspect, an outer side surface of the first conductor disposed in the first notch does not exceed beyond a side surface on which the first notch is provided on the array substrate; and an outer side surface of the second conductor disposed in the second notch does not extend beyond a side surface on which the second notch is provided on the opposite substrate.

In a possible implementation of the first aspect, the method further includes a first protective layer and a second protective layer, where the first protective layer covers the first end of the first conductor and the lead end of the drive circuit layer; and the second protective layer covers the second conductor, the lead end of the touch circuit, and the lead end of the drive circuit layer.

In a possible implementation of the first aspect, the substrate in the array substrate and the opposite substrate is any one of the following substrates:

a glass substrate, a flexible substrate, a steel sheet substrate, and a silicon substrate.

In a possible implementation of the first aspect, the second end of the first conductor is electrically connected to the main control board by using a flexible printed circuits board on glass.

In a possible implementation of the first aspect, the opposite substrate is a color film substrate, a liquid crystal is disposed between the color film substrate and the array substrate, and a backlight module is disposed on the back side of the array substrate.

In a possible implementation of the first aspect, the opposite substrate is a package cover plate, and an organic light emitting layer is disposed between the package cover plate and the array substrate.

In a possible implementation of the first aspect, a touch panel is further included, where the touch panel is disposed on the opposite substrate and is in contact with the touch circuit.

This application further provides a display device, including at least any one of the foregoing display modules.

The display device provided in this embodiment includes the display module, so that a total width of a black bezel of a display is reduced, and a screen-to-body ratio is increased, thereby implementing a narrow bezel of the display device, and reducing or avoiding a risk of screen cracking when the display device is dropped. Therefore, the problem that the total width of the black bezel of the display assembly is relatively large because a COF needs to be designed on one side of a display panel in the existing display device is resolved.

These and other aspects, implementation forms, and advantages of exemplary embodiments will become apparent from the embodiments described below with reference to the accompanying drawings. However, it should be understood that the specification and the accompanying drawings are for illustrative purposes only and are not intended to be a limitation on this application. For details, see the appended claims. Other aspects and advantages of this application will be set forth in the following description and will be apparent in part from the description or from the practice of this application. In addition, the aspects and advantages of this application may be implemented and obtained by means and combinations specifically noted in the appended claims.

DESCRIPTION OF REFERENCE NUMERALS

100—Display module:
10—Array substrate:
11—First notch:
111—First conductor;
12—Drive circuit layer;
121—Lead end of drive circuit layer;
122—Drive circuit;
101—Lead-out side;
20—Opposite substrate:
21—Touch circuit;
211—Lead end of touch circuit:
22—Second notch;
221—Second conductor;
31—First protective layer; and
32—Second protective layer.

DESCRIPTION OF EMBODIMENTS

Embodiment 1

Figure 1A:
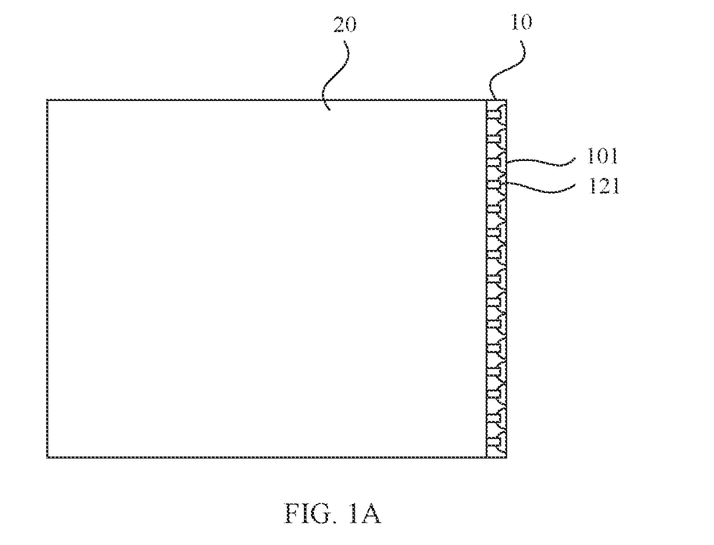
FIG. 1A is a schematic top view of a display module in which a first notch is not provided on a lead-out side of an array substrate according to Embodiment 1 of this application.
Figure 1B:
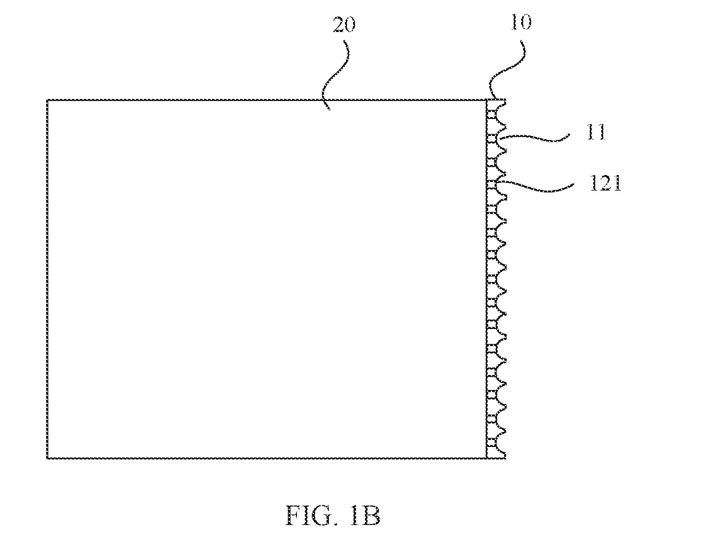
FIG. 1B is a schematic top view of a display module in which a first notch is provided on an edge of a lead-out side of an array substrate according to Embodiment 1 of this application.
Figure 1C:
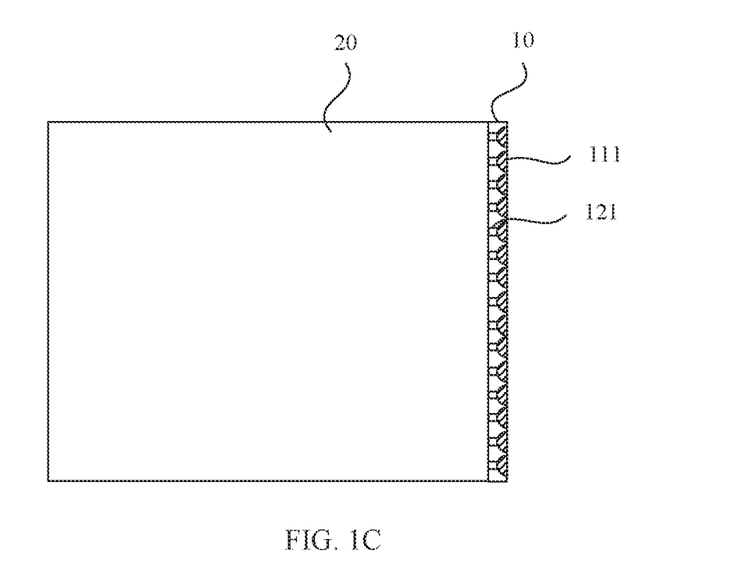
FIG. 1C is a schematic top view of the display module in which a first conductor disposed in the first notch according to Embodiment 1 of this application.

FIG. 1A is a schematic top view of a display module in which a first notch is not provided on a lead-out side of an array substrate according to Embodiment 1 of this application. FIG. 1B is a schematic top view of a display module in which a first notch is provided on an edge of a lead-out side of an array substrate according to Embodiment 1 of this application. FIG. 1C is a schematic top view of the display module in which a first conductor is disposed in the first notch according to Embodiment 1 of this application. FIG.

Figure 1D:
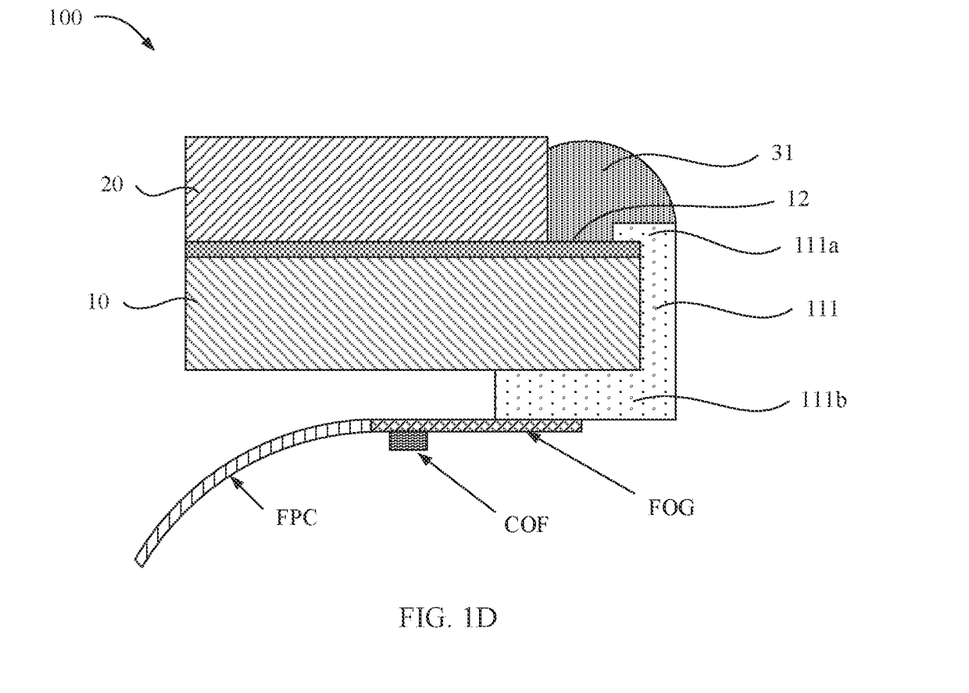
FIG. 1D is a schematic cross-sectional structural diagram of a display device according to Embodiment 1 of this application.

1D is a schematic cross-sectional structural diagram of a display device according to Embodiment 1 of this application.

As mentioned in the background, an existing display device has a problem that a narrow bezel of a screen cannot be implemented. Studies have found that the cause of the problem is that a COF needs to be designed on one side of a display panel of the existing display device, to output a drive circuit on an array substrate to a mainboard. However, a width of the COF is about 0.9 mm, and occupies 23% to 31% of a total width of a black bezel of a display. As a result, a non-display area at an edge of the display panel is relatively large, and finally, the entire black bezel of the display is relatively large. Therefore, the narrow bezel of the display cannot be implemented.

Therefore, to resolve the foregoing problem, in this embodiment, as shown in FIG. 1A to FIG. 1D, the display module 100 includes at least an array substrate 10, and the array substrate 10 has a drive circuit layer 12. Specifically, the array substrate 10 includes a substrate and the drive circuit layer 12 disposed on the substrate. In other words, the drive circuit layer 12 is located on one side that is of the substrate and that faces upward. A drive circuit in the drive circuit layer 12 usually needs to be led out from one side of the array substrate 10. To avoid additionally forming a bezel on an outer edge of a lead-out side of the display panel when the drive circuit is electrically connected to a main control board, in this embodiment, specifically, as shown in FIG. 1B, at least one first notch 11 is provided on an outer edge of a lead-out side 101 of the array substrate 10. In other words, in this embodiment, a notch rather than a through hole is provided on the edge of the array substrate 10, and the first notch 11 penetrates from a front surface of the array substrate 10 to a back surface of the array substrate 10. In addition, in this embodiment, a first conductor 111 is disposed in each first notch 11, a first end 111a of the first conductor 111 specifically extends toward the front surface of the array substrate 10 and is in contact with a lead end 121 of the drive circuit layer 12, and a second end 111b of the first conductor 111 extends along the first notch 11 to the back surface of the array substrate 10. In addition, the second end 111b of the first conductor 111 is used to electrically connect to the main control board disposed on a back side of the array substrate 10. In other words, in this embodiment, the first conductor 111 plays a role of connecting the drive circuit on the array substrate 10 to the back side of the array substrate 10. In addition, both ends of the first conductor 111 extend along the first notch 11 provided on the edge of the array substrate 10 to front and rear surfaces of the array substrate 10. Because the first notch 11 is provided inward from the outer edge of the array substrate 10, a second conductor does not additionally form a bezel on the outer edge of the array substrate 10. In this way, a problem of additionally forming a bezel when the drive circuit on the array substrate 10 is connected to the main control board is avoided.

However, in the related art, the drive circuit of the display panel is connected to the main control board by using a FOG, and a bezel is additionally formed when the drive circuit of the display panel is connected by using the FOG. Therefore, compared with the related art, in the display module 100 provided in this embodiment, because the drive circuit on the array substrate 10 is connected to the back side of the array substrate 10 by using the first conductor 111 in the first notch 11, the main control board is electrically connected to the drive circuit by using the first conductor 111 extending to the back side of the array substrate 10. However, the first conductor 111 is located in the first notch 11 on the edge of the array substrate 10. Therefore, a problem of additionally forming a bezel on the edge of the display panel is totally avoided. In this embodiment, a bezel formed during the FOG connection is avoided on the edge of the array substrate 10. In other words, the black bezel in the display is reduced by 0.9 mm, so that the total width of the black bezel is reduced. Compared with the related art, a narrow bezel of the display is implemented, and a screen-to-body ratio of the display is increased.

In this embodiment, it should be noted that, because the first notch 11 is provided on the edge of the array substrate 10, the first notch 11 is a non-closed opening. In other words, the first notch 11 is open on a top surface, a bottom surface, and a side surface of the array substrate 10. In this way, when the first conductor 111 is disposed in the first notch 11, an outer side surface of the first conductor 111 disposed in the first notch 11 does not exceed beyond a side surface on which the first notch 11 is provided on the array substrate 10. In other words, the first conductor 111 cannot exceed beyond the lead-out side 101. For example, when the first conductor 111 is disposed in the first notch 11, a part of the first conductor 111 that is located in the first notch 11 may be flush with the side surface on which the first notch 11 is provided on the array substrate 10, or there is a space between a part of the first conductor 111 that is located in the first notch 11 and the side surface on which the first notch 11 is provided on the array substrate 10. In other words, the first notch 11 is not filled with the first conductor 111, and a partial space in the first notch 11 is empty. In this embodiment, when the part of the first conductor 111 that is located in the first notch 11 does not extend beyond the side surface of the array substrate 10, it can be ensured that no new bezel is additionally formed on the outer edge of the array substrate 10 when the first conductor 111 connects the drive circuit to the back side of the array substrate 10.

In this embodiment, when the first notch 11 is provided on the outer edge of the lead-out side 101 of the array substrate 10, an opening size of the first notch 11 is acceptable provided that it is ensured that the first conductor 111 penetrates through the first notch 11 and the outer side surface of the first conductor 111 does not exceed beyond the side surface of the array substrate 10.

Because a substrate (namely, a substrate) in the array substrate 10 is usually a glass substrate, the drive circuit layer 12 is specifically disposed on the glass substrate. When a through hole (namely, a full hole) with an inner wall closed is provided on the edge of the lead-out side 101 of the array substrate 10, after the display module 100 is dropped, there is a serious risk of screen cracking. However, in this embodiment, the notch (namely, the first notch 11) is provided on the outer edge of the lead-out side 101 of the array substrate 10. In a notch providing process, the notch may directly extend inward from the edge of the array substrate 10 to form a through groove. In this way, on one hand, the glass substrate is not easily broken in the notch providing process; on the other hand, because the first notch 11 is located on the outer edge of the array substrate 10, and the first notch 11 is open on the top surface, the bottom surface, and the side surface of the array substrate 10, when the display module 100 is dropped, an impact force to which the array substrate 10 is subjected may be dispersed by the first notch 11, and a risk of screen cracking is not easily caused by stress concentration. It has been found through a drop simulation experiment, when a through hole with an aperture of 8 um is provided on the edge of the lead-out side 101 of the array substrate 10, in a drop simulation process, a maximum strain of the glass is 5546 ue. However, w % ben a notch (namely, a half-through hole) is provided on the edge of the lead-out side 101 of the array substrate 10, in the drop simulation process, a maximum strain of the glass is 1074 ue. In other words, a risk of screen cracking is reduced by 80% by providing the notch. Therefore, in this embodiment, by providing the first notch 11 on the edge of the lead-out side 101 of the array substrate 10, the risk of screen cracking is greatly reduced, and anti-drop reliability is high.

In addition, in this embodiment, when the drive circuit is connected to the main control board by using the first conductor 111, the drive circuit and the main control board may be directly electrically connected by using the first conductor 111. In this way, bending, hot pressing, and the like required for the FOG connection between the drive circuit and the main control board are avoided. Therefore, in this embodiment, materials such as FPCs and glass substrates required in an FOG connection process are reduced, and a process of connecting an FPC and a glass substrate in the FOG connection process is avoided.

In this embodiment, FIG. 1B only shows that the first notch 11 is provided on an edge of one lead-out side 101 of the array substrate 10. It should be noted that there may be a plurality of lead-out sides 101 of the array substrate 10. In this case, the first notch 11 is provided on an outer edge of each lead-out side 101 of the array substrate 10, a lead end at each lead-out side 101 on the array substrate 10 is connected to the back side of the array substrate 10 by using the first conductor 111 in a corresponding notch, and then cabling is unified to be electrically connected to the main control board.

In this embodiment, it should be noted that, a quantity of first notches 11 provided on the outer edge of the lead-out side 101 of the array substrate 10 is specifically in a one-to-one correspondence with a quantity of lead ends at the lead-out side 101. In this way, each lead on the array substrate 10 can be guided to the back side of the array substrate 10 by using the first conductor 111.

In this embodiment, the first conductor 111 is a conductive material filled in the first notch 11, or the first conductor 111 is a conductive wire. In this way, the first conductor 111 penetrates through the first notch 11 and is electrically connected to the drive circuit and the main control board separately.

Therefore, in the display module 100 provided in this embodiment, at least one first notch 11 is disposed on the outer edge of the lead-out side 101 of the array substrate 10, and the first conductor 11 is disposed in each first notch 11. The first end 111a of the first conductor III is in contact with the lead end of the drive circuit layer 12, and the second end 111b of the first conductor 111 extends along the first notch 11 to the back side of the array substrate 10. In this way, the main control board is electrically connected to the drive circuit by using the first conductor 111 extending to the back side of the array substrate 10. However, the first conductor 111 is located in the first notch 11 provided on the edge of the array substrate 10. Therefore, the problem of additionally forming a bezel on the edge of the display panel is totally avoided. Compared with the related art, a bezel formed during the FOG connection is avoided, so that a total width of a black bezel in the display is reduced, a narrow bezel of the display is implemented, and a screen-to-body ratio of the display is increased. In addition, when the first conductor III is used to connect the drive circuit to the main control board, quantities of used FPCs and glass substrates are reduced, and a process of connecting an FPC and a glass substrate in an FOG connection process is avoided. In addition, in this application, because the outer edge of the lead-out side 101 of the array substrate 10 is provided with a notch, compared with a full through hole, a risk of screen cracking in a dropping process is greatly reduced, and anti-drop reliability is higher. Therefore, the display module 100 provided in this embodiment implements the narrow bezel of the display, reduces the risk of screen cracking in the dropping process, reduces the quantities of used FPCs and glass substrates, and resolves the problem that an existing display cannot meet a narrow bezel requirement because a COF needs to be designed on one side of a display panel of the display.

In this embodiment, an inner wall of the first notch 11 is a non-closed arcuate wall. In other words, the inner wall of the first notch 11 is connected to the side surface of the array substrate 10, and the inner wall of the first notch 11 is an arcuate surface. Specifically, as shown in FIG. 1B, the first notch 11 is an arc-shaped groove bent inward to the array substrate 10.

Further, in this embodiment, the first notch 11 is a semi-circular hole penetrating through front and rear surfaces of the array substrate 10. Specifically, as shown in FIG. 1B, a transverse cross-section of the first notch 11 is semi-circular. In this embodiment, when the first notch 11 is a semi-circular hole, a diameter of the semi-circular hole may be 5-20 um.

Further, in this embodiment, the first notch 11 is a semi-conical hole whose opening gradually decreases from top to bottom. In other words, in this embodiment, the first notch 11 is a semi-conical hole, a large end of the semi-conical hole faces one side on which the drive circuit layer 12 is disposed on the array substrate 10, and a small end of the semi-conical hole faces the back side of the array substrate 10. In this embodiment, when the first conductor 111 is a conductive material, the conductive material is easily filled in the semi-conical hole, and because the first notch 11 is a semi-conical hole, the conductive material is also semi-conical after the semi-conical hole is filled. In this way, a gap is hardly likely to occur between the conductive materials under the action of gravity, thereby ensuring that the first conductor 111 has a reliable conductive capability.

Further, in this embodiment, when the first conductor 111 is in contact with the lead end of the array substrate 10 to implement electrical connection, the first end 111a of the first conductor 111 and the lead end of the array substrate 10 are usually exposed. To protect the exposed first end 111a of the first conductor 111 and the exposed lead end of the array substrate 10, specifically, a first protective layer 31 is further included. Specifically, the first protective layer 31 is insulation glue. The first protective layer 31 covers the first end 111a of the first conductor 111 and the exposed lead end of the array substrate 10. In this way, under the protection of the first protective layer 31, the exposed first end 111a of the first conductor 111 and the exposed lead end of the array substrate 10 are not easily damaged.

Further, in this embodiment, when the second end 111b of the first conductor 111 extends to the back side of the array substrate 10, in order to electrically connect the second end 111b of the first conductor 111 to the main control board, specifically, in this embodiment, the second end 111b of the first conductor 111 is electrically connected to the main control board by using a flexible printed circuits board on glass (namely, FOG). Specifically, the COF or the FPC is bound to the second end 111b of the first conductor 111 on the back side of the array substrate 10 in an anisotropic conductive film (Anisotropic Conductive Film, ACF) manner, to form electrical connection. In addition, the FPC or the COF leads the wire in a reverse direction of the first notch 11, to avoid forming a new bezel width.

Embodiment 2

Figure 2A:
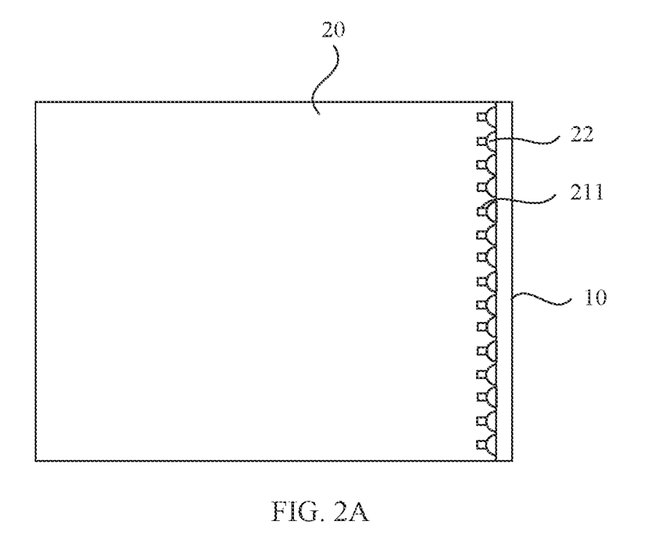
FIG. 2A is a schematic top view of a display module in which a second notch is provided on an edge of a lead-out side of an opposite substrate according to Embodiment 2 of this application.
Figure 2B:
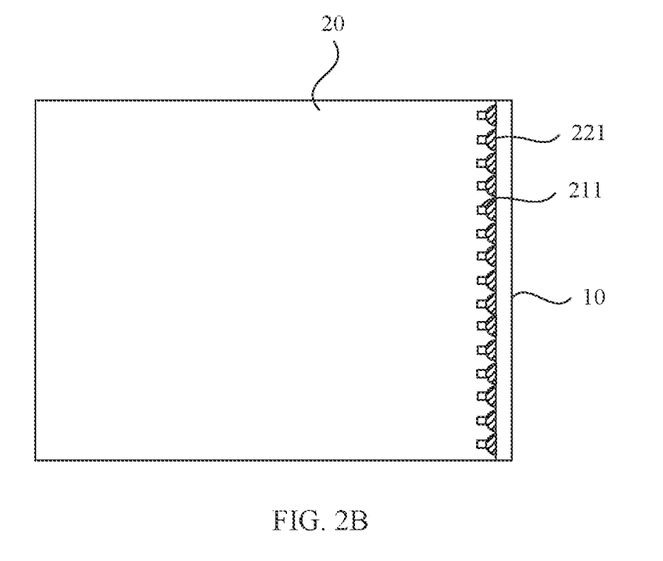
FIG. 2B is a schematic top view of the display module in which a second conductor is disposed in the second notch according to Embodiment 2 of this application.
Figure 2C:
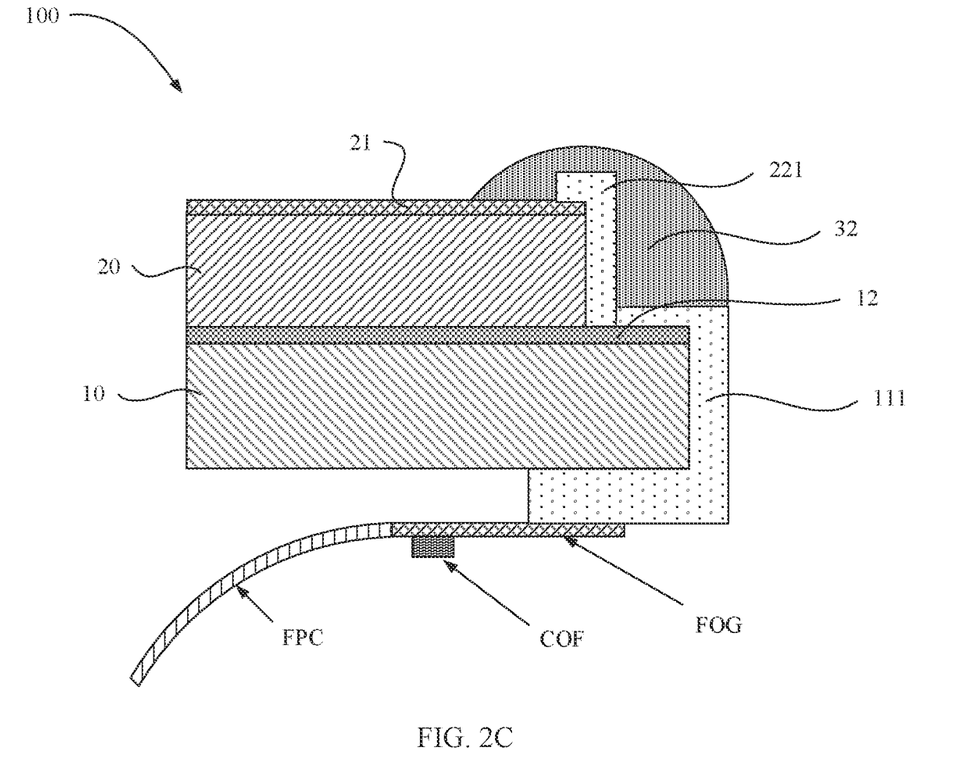
FIG. 2C is a schematic cross-sectional structural diagram of a display device according to Embodiment 2 of this application.
Figure 2D:
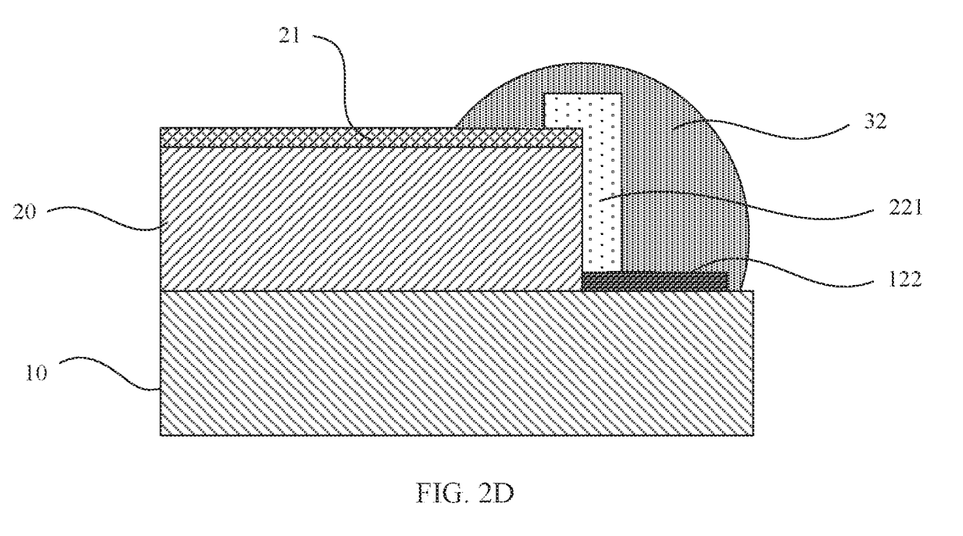
FIG. 2D is another schematic cross-sectional structural diagram of a display device according to Embodiment 2 of this application.

FIG. 2A is a schematic top view of a display module in which a second notch is provided on an edge of a lead-out side of an opposite substrate according to Embodiment 2 of this application. FIG. 2B is a schematic top view of the display module in which a second conductor is disposed in the second notch according to Embodiment 2 of this application. FIG. 2C is a schematic cross-sectional structural diagram of a display device according to Embodiment 2 of this application. FIG. 2D is another schematic cross-sectional structural diagram of the display device according to Embodiment 2 of this application.

In this embodiment, as shown in FIG. 2A to FIG. 2D, the display module 100 further includes an opposite substrate 20 opposite to the array substrate 10. A touch circuit 21 is disposed on the opposite substrate 20. In other words, in this embodiment, to enable the display module 100 to implement a touch function, the touch circuit 21 is disposed on the opposite substrate 20 of the display module 100. The touch circuit 21 needs to be electrically connected to a main control board disposed on a back side of the array substrate 10. In the related art. FOG connection is usually used. However, because a new bezel is formed on an outer edge of the display panel during the FOG connection, in this embodiment, to avoid forming a new bezel on the outer edge of the opposite substrate 20, specifically, at least one second notch 22 is provided on an outer edge corresponding to a lead-out side 101 of the array substrate 10 on the opposite substrate 20. A second conductor 221 is disposed in each second notch 22, a first end of the second conductor 221 is in contact with a lead end 211 of the touch circuit 21, and a second end of the second conductor 221 extends along the second notch 22 toward the array substrate 10 and is electrically connected to a first end 111a of a first conductor 111. In this way, the touch circuit 21 is connected to the back side of the array substrate 10 by using the first conductor 111 and the second conductor 221, and the main control board is electrically connected to the touch circuit 21 by connecting to the conductors on the back side of the array substrate 10.

In this embodiment, by providing the second notch 22 on the outer edge of the opposite substrate 20, both ends of the second conductor 221 extend along the second notch 22 to one side on which the touch circuit 21 is disposed on the opposite substrate 20 and one side on which the opposite substrate 20 faces the array substrate 10. Finally, the touch circuit 21 is connected to the main control board by using the second conductor 221 and the first conductor 111. In other words, the touch circuit 21 on the opposite substrate 20 is connected to the back side of the array substrate 10, and forming a new bezel on the outer edge of the opposite substrate 20 is avoided.

In this embodiment, when the touch circuit 21 on the opposite substrate 20 is connected to the back side of the array substrate 10, as shown in FIG. 2C, the touch circuit 21 may be directly connected to the back side of the array substrate 10 by using the first conductor 111 and the second conductor 221, or as shown in FIG. 2D, the touch circuit 21 may be first connected to a drive circuit 122 on the array substrate 10 by using the second conductor 221, and then connected to the back side of the array substrate 10 by using the first conductor 111.

In this embodiment, an inner wall of the second notch 22 is a non-closed arcuate wall. In other words, the inner wall of the second notch 22 is connected to a side surface of the opposite substrate 20, and the inner wall of the second notch 22 is an arcuate surface. Specifically, as shown in FIG. 2B, the second notch 22 is an arcuate groove bent inward to the opposite substrate 20.

Further, in this embodiment, the second notch 22 is a semi-circular hole penetrating through front and rear surfaces of the opposite substrate 20. Specifically, as shown in FIG. 1B, a transverse cross-section of the second notch 22 is semi-circular. In this embodiment, when the second notch 22 is a semi-circular hole, a diameter of the semicircular hole may be 5-20 um.

Further, in this embodiment, the second notch 22 is a semi-conical hole whose opening gradually decreases from top to bottom. In other words, in this embodiment, the second notch 22 is a semi-conical hole, a large end of the semi-conical hole faces one side on which the touch circuit 21 is disposed on the opposite substrate 20, and a small end of the semi-conical hole faces the back side of the opposite substrate 20. In this embodiment, when the second conductor 221 is a conductive material, the conductive material is easily filled in the semi-conical hole, and because the second notch 22 is a semi-conical hole, the conductive material is also semi-conical after the semi-conical hole is filled. In this way, a gap is hardly likely to occur between the conductive materials under the action of gravity, thereby ensuring that the first conductor 111 has a reliable conductive capability.

Further, in this embodiment, when the second conductor 221 is in contact with a lead end of the opposite substrate 20 to implement electrical connection, the first end of the second conductor 221 and the lead end 211 of the opposite substrate 20 are usually exposed. To protect the exposed first end 111a of the first conductor 111 and the exposed lead end of the opposite substrate 20, specifically, a second protective layer 32 is further included. Specifically, the second protective layer 32 is insulation glue. The second protective layer 32 covers the second conductor 221, the lead end 211 of the touch circuit 21, and the lead end 121 of the drive circuit layer 12. In this way, under the protection of the second protective layer 32, the exposed second conductor 221, the exposed lead end of the opposite substrate 20, and the exposed lead end of the array substrate 10 are not easily damaged.

In this embodiment, an outer side surface of the second conductor 221 disposed in the second notch 22 does not extend beyond a side surface on which the second notch 22 is disposed on the opposite substrate 20. For example, a part of the second conductor 221 that is located in the second notch 22 may be flush with the side surface on which the second notch 22 is disposed on the opposite substrate 20, or there is a space between a part of the second conductor 221 that is located in the second notch 22 and the side surface on which the second notch 22 is disposed on the opposite substrate 20. In other words, the second notch 22 is not filled with the second conductor 221, and a partial space in the second notch 22 is empty. In this embodiment, when the part of the second conductor 221 that is located in the second notch 22 does not extend beyond the side surface of the opposite substrate 20, it can be ensured that no new bezel is additionally formed on the outer edge of the opposite substrate 20 when the second conductor 221 connects the drive circuit to the back side of the array substrate 10.

Based on the foregoing Embodiment 1 and Embodiment 2, in this embodiment, specifically, the substrate in the array substrate 10 and the opposite substrate 20 is any one of a glass substrate, a flexible substrate, a steel sheet substrate, and a silicon substrate. For example, the substrate in the array substrate 10 and the opposite substrate 20 may be a glass substrate, so that a hard screen display module 100 is formed. Alternatively, in this embodiment, the substrate in the array substrate 10 and the opposite substrate 20 may be a flexible substrate, so that a flexible screen display module 100 is formed.

Based on the foregoing Embodiment 1 and Embodiment 2, in this embodiment, the opposite substrate 20 is specifically a color film substrate, and a liquid crystal is disposed between the color film substrate and the array substrate 10. In this case, the display module 100 is an LCD display module. A backlight module is disposed on the back side of the array substrate 10. It should be noted that, for other structures in the LCD display module, for example, a polarizer, a thin film transistor (TFT), a guide film, and a color filter, refer to the related art. In this embodiment, other structures m the LCD display module are not described again.

Based on the foregoing Embodiment 1 and Embodiment 2, in this embodiment, the opposite substrate 20 is a package cover plate, and an organic light emitting layer (OLED) is disposed between the package cover plate and the array substrate 10. The organic light emitting layer includes an anode, a light emitting layer, and an anode that are sequentially stacked. In this case, the display module 100 is an OLED display module. It should be noted that, for other structures in the OLED display module, for example, a polarizer and a thin film transistor (TFT), refer to the related art. Details are not described again in this embodiment.

Based on the foregoing Embodiment 1 and Embodiment 2, in this embodiment, a touch panel is further included. The touch panel is disposed on the opposite substrate 20 and is in contact with the touch circuit 21. In this case, the display module 100 is a touch display module. In this embodiment, a touch mode of the touch panel includes but is not limited to capacitive touch or surface acoustic wave touch.

Embodiment 3

This embodiment provides a display device, including at least the display module 100 in any one of the foregoing embodiments. The display device provided in this embodiment may be specifically a display device that uses an OLED/LCD or another display mode, such as a smartphone, a tablet computer, an in-vehicle device, or a wearable device. In this embodiment, the display device may be a flexible display device or a hard screen display device.

The display device provided in this embodiment includes the display module 100. In the display module 100, at least one first notch 11 is provided on an outer edge of a lead-out side 101 of an array substrate 10, and a first conductor 111 is disposed in each first notch 11. A first end 111a of the first conductor 111 is in contact with a lead end 121 of a drive circuit layer 12, and a second end 111b of the first conductor 111 extends along the first notch 11 to a back side of the array substrate 10. In this way, a main control board is electrically connected to a drive circuit by using the first conductor 111 extending to the back side of the array substrate 10. The first conductor 111 is located in the first notch 11 provided on the edge of the array substrate 10. Therefore, a problem of additionally forming a bezel on an edge of the display panel is totally avoided. Compared with the related art, a bezel formed during FOG connection is avoided, so that a total width of a black bezel in the display is reduced, a narrow bezel of the display is implemented, and a screen-to-body ratio of the display is increased. In addition, when the first conductor 111 is used to connect the drive circuit to the main control board, quantities of used FPCs and glass substrates are reduced, and a process of connecting an FPC and a glass substrate in an FOG connection process is avoided. In addition, in this application, because an outer edge of the lead-out side 101 of the array substrate 10 is provided with a notch, compared with a full through hole, a risk of screen cracking in a dropping process is greatly reduced, and anti-drop reliability is higher. Therefore, according to the display device provided in this embodiment, a total width of a black bezel of the display is reduced, and a screen-to-body ratio is increased, thereby implementing a narrow bezel of the display device, and the risk of screen cracking when the display device is dropped is reduced or avoided, thereby resolving a problem that a total width of a black bezel of display assembly is relatively large because a COF needs to be designed on one side of a display panel in an existing display device.

In the description of this application, it should be noted that, unless otherwise expressly specified and limited, the terms "installed", "connected", and "connection" should be broadly understood, for example, may be a fixed connection, may be an indirect connection by using an intermediate medium, or may be a connection within two elements or an interaction relationship between two elements. A person of ordinary skill in the art may understand specific meanings of the terms in this application based on specific cases.

In the description of this application, it should be understood that an orientation or location relationship indicated by the terms "upper", "lower". "front", "rear", "vertical", "horizontal", "top", "bottom", "inner", and "outer" is the orientation or location relationship shown in the accompanying drawings, and is merely for ease of describing this application and simplifying the description, but does not indicate or imply that the indicated device or element needs to have a specific orientation or be configured and operated in a specific orientation. Therefore, it cannot be construed as a limitation on this application. In the description of this application, "a plurality of" means two or more, unless otherwise precisely and specifically specified.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of this application described herein can be implemented in orders except the order illustrated or described herein. Moreover, the terms "include", "contain" and any other variants mean to cover the non-exclusive inclusion, for example, a process, method, system, product, or device that includes a list of steps or units is not necessarily limited to those units, but may include other units not expressly listed or inherent to such a process, method, system, product, or device.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A display, comprising:
a main control board;
an array substrate disposed on the main control board and comprising a drive circuit layer, wherein a first notch is provided on an outer edge of a lead-out side of the array substrate;
a first conductor disposed in the first notch and comprising:
a first end in contact with a lead end of the drive circuit layer; and
a second end extending along the first notch to a back side of the array substrate and coupling to the main control board;
an opposite substrate opposite to the array substrate, wherein a second notch is provided on an outer edge of the opposite substrate that corresponds to the lead-out side of the array substrate;
a touch circuit disposed on the opposite substrate; and
a second conductor disposed in the second notch and comprising:
a third end in contact with a lead end of the touch circuit; and
a fourth end extending along the second notch to the array substrate and electrically coupling to the first end of the first conductor,
wherein the touch circuit is electrically coupled to the main control board using the first conductor and the second conductor, and
wherein inner walls of the first notch and the second notch are non-closed arcuate walls.

2. The display of claim 1, wherein the first notch and the second notch are semi-circular holes penetrating through a front surface and a rear surface of the array substrate.

3. The display of claim 1, wherein the first notch and the second notch are semi-conical holes with openings that gradually decrease from top to bottom.

4. The display of claim 3, wherein a first outer side surface of the first conductor disposed in the first notch does not extend beyond a first side surface of the first notch, and wherein a second outer side surface of the second conductor disposed in the second notch does not extend beyond a second side surface of the second notch.

5. The display of claim 1, wherein the first conductor and the second conductor are made of conductive materials that fill the first notch and the second notch.

6. The display of claim 1, wherein the first conductor and the second conductor are conductive wires.

7. The display of claim 1, further comprising:
a first protective layer that covers the first end of the first conductor and the lead end of the drive circuit layer; and
a second protective layer that covers the second conductor, the lead end of the touch circuit, and the lead end of the drive circuit layer.

8. The display of claim 1, wherein each of the array substrate and the opposite substrate is any one of a glass substrate, a flexible substrate, a steel sheet substrate, or a silicon substrate.

9. The display of claim 1, wherein the opposite substrate is a color film substrate, and wherein the display further comprises:
a liquid crystal disposed between the color film substrate and the array substrate; and
a backlight module disposed on the back side of the array substrate.

10. The display of claim 1, wherein the opposite substrate is a package cover plate, and wherein the display further comprises an organic light emitting layer disposed between the package cover plate and the array substrate.

11. The display of claim 1, further comprising a touch panel disposed on the opposite substrate and in contact with the touch circuit.

12. The display of claim 1, wherein the second end of the first conductor is electrically coupled to the main control board using a flexible printed circuit board on glass.

13. A display device, comprising:
a bezel;
an array substrate disposed within the bezel and comprising a drive circuit layer, wherein a first notch is provided on an outer edge of a lead-out side of the array substrate;
a first conductor disposed in the first notch and comprising:
a first end in contact with a lead end of the drive circuit layer; and
a second end of the first conductor extends along the first notch to a back side of the array substrate, wherein the second end of the first conductor is configured to electrically couple to a main control board disposed on the back side of the array substrate;
an opposite substrate opposite to the array substrate;
a touch circuit disposed on the opposite substrate;
a second notch provided on an outer edge on the opposite substrate that corresponds to the lead-out side of the array substrate; and
a second conductor disposed in the second notch and comprising:
a third end in contact with a lead end of the touch circuit; and
a fourth end extending along the second notch to the array substrate and is electrically coupled to the first end of the first conductor,
wherein the touch circuit is electrically coupled to the main control board using the first conductor and the second conductor, and
wherein the first notch and the second notch are semi-circular holes penetrating through a front surface and a rear surface of the array substrate.

14. The display device of claim 13, wherein the first notch and the second notch are semi-circular holes penetrating through a front surface and a rear surface of the array substrate.

15. The display device of claim 13, wherein the first notch and the second notch are semi-conical holes with openings that gradually decrease from top to bottom.

16. A display, comprising:
a main control board;
an array substrate disposed on the main control board and comprising a drive circuit layer, wherein a first notch is provided on an outer edge of a lead-out side of the array substrate;
a first conductor disposed in the first notch and comprising:
a first end in contact with a lead end of the drive circuit layer; and
a second end extending along the first notch to a back side of the array substrate and coupling to the main control board;

an opposite substrate opposite to the array substrate, wherein a second notch is provided on an outer edge of the opposite substrate that corresponds to the lead-out side of the array substrate;

a touch circuit disposed on the opposite substrate;

a second conductor disposed in the second notch and comprising:

a third end in contact with a lead end of the touch circuit; and a fourth end extending along the second notch to the array substrate and electrically coupling to the first end of the first conductor, wherein the touch circuit is electrically coupled to the main control board using the first conductor and the second conductor;

a first protective layer that covers the first end of the first conductor and the lead end of the drive circuit layer; and a second protective layer that covers the second conductor, the lead end of the touch circuit, and the lead end of the drive circuit layer.

17. The display of claim 16, wherein inner walls of the first notch and the second notch are non-closed arcuate walls.

18. The display of claim 16, wherein the first conductor and the second conductor are made of conductive materials that fill the first notch and the second notch.

19. The display of claim 16, wherein the first conductor and the second conductor are conductive wires.

20. The display of claim 16, wherein the opposite substrate is a color film substrate, and wherein the display further comprises:

a liquid crystal disposed between the color film substrate and the array substrate; and a backlight module disposed on the back side of the array substrate.

* * * * *